United States Patent
Liu et al.

(10) Patent No.: US 9,093,476 B2
(45) Date of Patent: Jul. 28, 2015

(54) INTEGRATED CIRCUITS HAVING FINFETS WITH IMPROVED DOPED CHANNEL REGIONS AND METHODS FOR FABRICATING SAME

(71) Applicant: GLOBALFOUNDRIES, Inc., Grand Cayman (KY)

(72) Inventors: Jinping Liu, Ballston Lake, NY (US); Bharat Krishnan, Clifton Park, NY (US); Bongki Lee, Malta, NY (US); Vidmantas Sargunas, Clifton Park, NY (US); Weihua Tong, Mechanicville, NY (US); Seung Kim, Mechanicville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/954,289

(22) Filed: Jul. 30, 2013

(65) Prior Publication Data

US 2015/0035062 A1 Feb. 5, 2015

(51) Int. Cl.
*H01L 21/8238* (2006.01)
*H01L 29/66* (2006.01)
*H01L 29/78* (2006.01)

(52) U.S. Cl.
CPC .. *H01L 29/66795* (2013.01); *H01L 21/823821* (2013.01); *H01L 29/785* (2013.01)

(58) Field of Classification Search
CPC ............ H01L 27/0886; H01L 27/0924; H01L 27/10826; H01L 27/10879; H01L 27/1211; H01L 29/785
USPC .......... 438/199, 300, 301, 302; 257/E21.632, 257/E21.619, E21.634
See application file for complete search history.

(56) References Cited

U.S. PATENT DOCUMENTS

| | | | |
|---|---|---|---|
| 8,058,123 B2 | 11/2011 | Liu et al. | |
| 2008/0265321 A1* | 10/2008 | Yu et al. | 257/344 |
| 2013/0146942 A1* | 6/2013 | Zhu et al. | 257/190 |
| 2013/0183804 A1* | 7/2013 | Wang et al. | 438/285 |

* cited by examiner

*Primary Examiner* — Hoai V Pham
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes forming a channel region of a fin structure with a first side, a second side, an exposed first end surface and an exposed second end surface. A gate is formed overlying the first side and second side of the channel region. The method includes implanting ions into the channel region through the exposed first end surface and the exposed second end surface. Further, the method includes forming source/drain regions of the fin structure adjacent the exposed first end surface and the exposed second end surface of the channel region.

20 Claims, 5 Drawing Sheets

FIG. 12

INTEGRATED CIRCUITS HAVING FINFETS WITH IMPROVED DOPED CHANNEL REGIONS AND METHODS FOR FABRICATING SAME

TECHNICAL FIELD

The present disclosure generally relates to integrated circuits and methods for fabricating integrated circuits, and more particularly relates to integrated circuits and methods for fabricating integrated circuits having FinFETs with improved doped channel regions.

BACKGROUND

Transistors such as metal oxide semiconductor field effect transistors (MOSFETs) or simply field effect transistors (FETs) are the core building blocks of the vast majority of semiconductor integrated circuits. A FET includes source and drain regions between which a current can flow through a channel under the influence of a bias applied to a gate electrode that overlies the channel. Some integrated circuits, such as high performance microprocessors, can include millions of FETs. For such integrated circuits, decreasing transistor size and thus increasing transistor density has traditionally been a high priority in the semiconductor manufacturing industry. Transistor performance, however, must be maintained even as the transistor size decreases.

A FinFET is a type of transistor that lends itself to the dual goals of reducing transistor size while maintaining transistor performance. The FinFET is a three dimensional transistor formed in a thin fin structure that extends upwardly from a semiconductor substrate. Transistor performance, often measured by its transconductance, is proportional to the width of the transistor channel. In a FinFET the transistor channel is formed along and between the vertical sidewalls of the fin structure, so a wide channel, and hence high performance, can be achieved without substantially increasing the area of the substrate surface required by the transistor.

One important challenge with the implementation of FinFETs at reduced technology nodes is the improper doping of channel regions in the fin structures. Conventional processes dope fin structures at their surfaces and require annealing to diffuse dopants to desired locations deeper in the fin structures. During such processes, channel regions are encapsulated by overlying gate structures and surrounding source/drain regions and are doped by directing dopant ions through the adjacent source/drain regions. Therefore, desired doping of channel regions is difficult to attain. Further, while source/drain regions are doped directly through their surfaces, the thermal anneal processes required to move the dopants to desired locations often result in unwanted movement of source/drain dopants into channel regions.

Accordingly, it is desirable to provide integrated circuits and methods for fabricating integrated circuits having FinFETs with improved doped channel regions. In addition, it is desirable to provide methods for fabricating integrated circuits that implant dopants directly into channel regions through exposed channel region surfaces. Also, it is desirable to provide integrated circuits and methods for fabricating integrated circuits that form uniformly doped channel regions. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with an exemplary embodiment, a method for fabricating an integrated circuit includes forming a channel region of a fin structure with a first side, a second side, an exposed first end surface and an exposed second end surface. A gate is formed overlying the first side and second side of the channel region. The method includes implanting ions into the channel region through the exposed first end surface and the exposed second end surface. Further, the method includes forming source/drain regions of the fin structure adjacent the exposed first end surface and the exposed second end surface of the channel region.

In another embodiment, a method for fabricating an integrated circuit includes forming a first fin structure overlying a first type region in a semiconductor substrate and forming a second fin structure overlying a second type region in the semiconductor substrate. A gate is formed overlying each fin structure and defines a channel region in each fin structure. The method includes masking the second type region and etching the first fin structure around the gate in the first fin structure to expose the channel region in the first fin structure. Further, the method includes doping the channel region in the first fin structure, and forming source/drain regions of the first fin structure around the channel region in the first fin structure.

In accordance with another embodiment, an integrated circuit is provided. The integrated circuit includes a semiconductor substrate and a fin structure overlying the semiconductor substrate. The integrated circuit further includes a gate overlying the fin structure and defining a channel region between source/drain regions in the fin structure. The channel region is completely doped.

BRIEF DESCRIPTION OF THE DRAWINGS

Embodiments of integrated circuits having FinFETs with improved doped channel regions and methods for fabricating integrated circuits having FinFETs with improved doped channel regions will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits and methods for fabricating integrated circuits having FinFETs with improved doped channel regions are provided. Problems faced by conventional processes when forming FinFETs may be avoided. For example, proper dopant distribution in channel regions of FinFETs formed herein does not rely on diffusion during annealing. Further, diffusion of dopants from source/drain regions into channel regions may be inhibited. To provide improved doped channel regions, the methods described herein expose the end surfaces of channel regions. As a result, dopant ions may be introduced directly into the channel regions through the exposed end surfaces, rather than through adjacent source/drain regions. Source/drain regions may be formed around the channel regions after doping.

Figure 1:
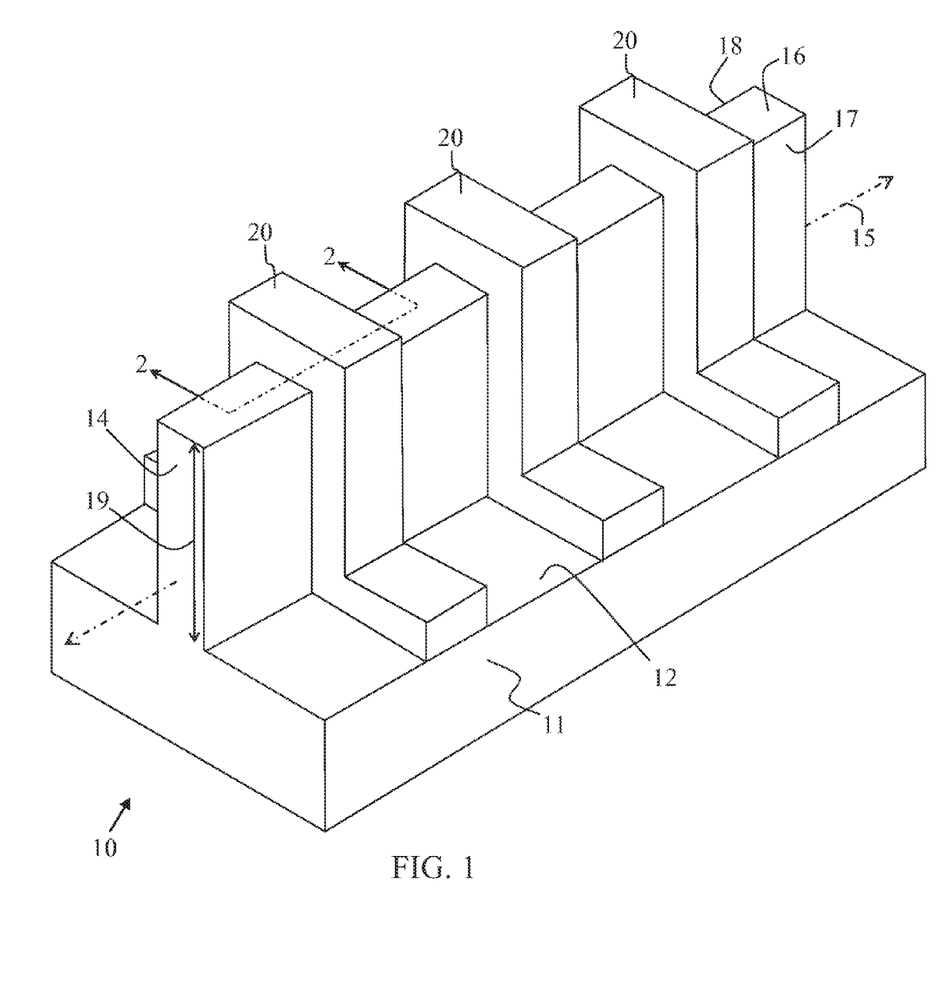
FIG. 1 illustrates, in perspective view, a portion of an integrated circuit having a FinFET in accordance with an embodiment herein.

FIGS. 1-12 illustrate steps in accordance with various embodiments of methods for fabricating integrated circuits. FIG. 1 provides a perspective view of a plurality of gates overlying a fin structure as a reference for the method steps. FIGS. 2-8 illustrate a method for forming a portion of an integrated circuit with a FinFET having a doped channel region, while FIGS. 9-12 illustrate a method for forming an integrated circuit with such FinFETs over an NFET region and over a PFET region. The processes and steps discussed in relation to one illustrated embodiment are applicable to other illustrated embodiments. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 2:
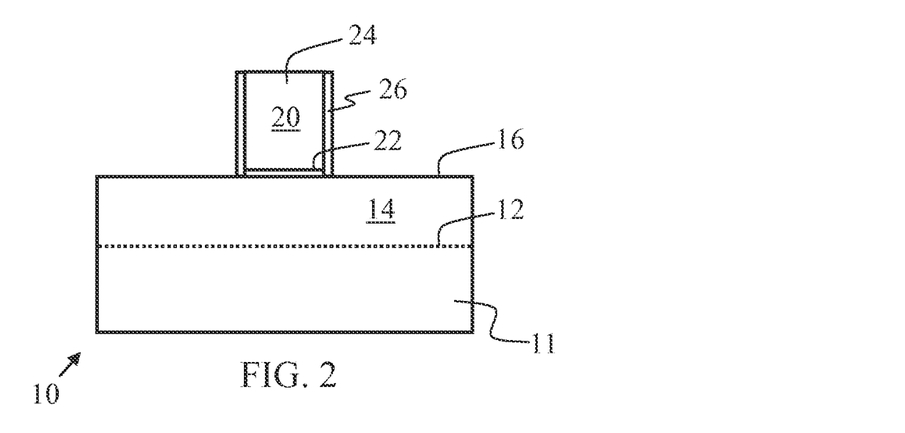
FIGS. 2-8 illustrate, in cross section taken along line 2-2 of FIG. 1, a portion of an integrated circuit and method steps for fabricating an integrated circuit having a FinFET in accordance with various embodiments herein.

FIGS. 1 and 2 illustrate steps in an exemplary embodiment of a method for fabricating an integrated circuit 10. FIG. 1 is a perspective view of a portion of an integrated circuit 10, and FIG. 2 is a cross-sectional view taken along line 2-2 in FIG. 1. As shown, the method begins by providing a semiconductor substrate 11, such as a bulk silicon substrate, a silicon-on-insulator substrate, or a substrate of other semiconductor material. The semiconductor substrate is formed with a substantially planar surface 12. A non-planar structure, such as a fin structure 14, is formed on the surface 12 of the semiconductor substrate 11. The fin structure 14 extends in the direction of a fin axis 15 (shown only in FIG. 1) and has a top surface 16 and side surfaces 17 and 18 (shown only in FIG. 1) that are parallel and extend along the fin axis 15. The fin structure 14 is formed according to known processes. For instance, when using a bulk semiconductor substrate 11, upper portions of the semiconductor material of the semiconductor substrate 11 are etched or otherwise removed leaving fin structures 14 formed and extending upward from the surface 12 of the remaining semiconductor material and supported by the remaining semiconductor substrate 11. As shown in FIG. 1, the fin structure 14 has a fin height indicated by double headed arrow 19 (shown only in FIG. 1) extending between the surface 12 of the semiconductor substrate 11 and the top surface 16 of the fin structure 14.

In FIGS. 1 and 2, gate structures 20 are formed across the fin structure 14 and extend substantially perpendicular to the fin axis 15. The gate structures 20 are formed by typical lithographic processing and other methods and extend over the top surface 16 and side surfaces 17 and 18 of the fin structure 14 to the surface 12 of the semiconductor substrate 11. In certain embodiments, a dielectric material may be provided overlying the surface 12 of the semiconductor substrate 11 such that the gate structure 20 does not lie directly on the semiconductor substrate 11.

In an embodiment, the gate structures 20 include a gate insulator and an overlying gate electrode structure. The gate electrode structure may be formed from a gate conductor material such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate insulator may include silicon oxides, such as thermal or deposited oxides, and high-k dielectrics. The high-k gate dielectrics may include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride.

While FIG. 1 illustrates three gate structures 20, any suitable number may be formed as is known in conventional processing. For clarity, FIG. 2 illustrates a single gate structure 20. In FIG. 2, the exemplary gate structure 20 includes a gate insulator layer 22 between the fin structure 14 and a gate electrode material 24. Further, the exemplary gate structure 20 includes a gate dielectric liner 26. While the gate dielectric layer 22 and gate dielectric liner 26 may be any suitable material, in an exemplary embodiment they are silicon oxide as used in conventional processing.

Figure 3:
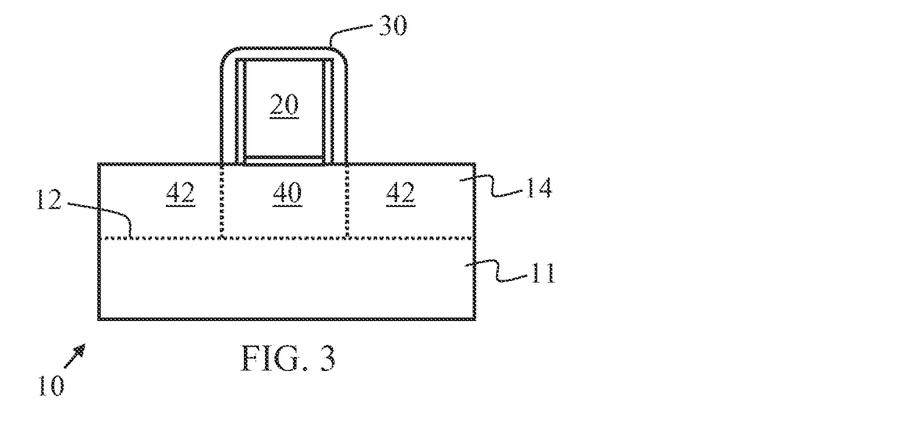

In FIG. 3, a spacer 30 is formed around the gate structure 20. For example, a spacer material, such as silicon nitride, may be blanket deposited over the gate structure 20, the fin structure 14, and semiconductor substrate 11 and etched to form the illustrated spacer 30 in accordance with well-known lithography processes. As shown, the gate structure 20 and spacer 30 define a channel region 40 between end regions 42 in the fin structure 14.

Figure 4:
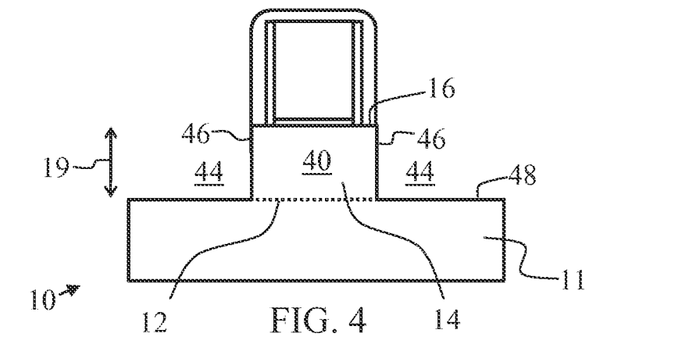

An etch is performed to remove the end regions 42 to form trenches 44 in FIG. 4. For example, a wet etch selective to the fin structure material over the spacer material may be used. As shown, the etch exposes opposite end surfaces 46 of the channel region 40 and is performed until a lower trench surface 48 is coplanar with the surface 12 of the semiconductor substrate 11. The end surfaces 46 extend from the lower trench surface 48 (or surface 12 of the semiconductor substrate 11) to the top surface 16 of the fin structure 14, i.e., their length equals the fin height 19, and bound the channel region 40.

Figure 5:
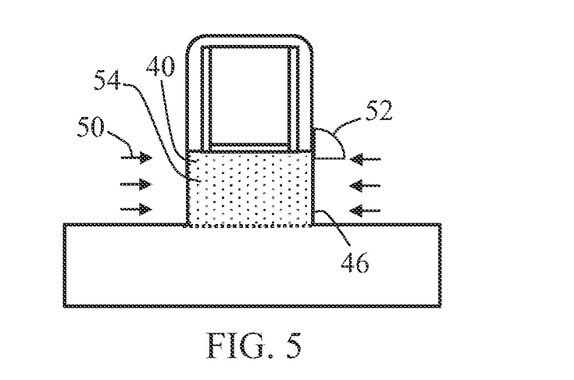

After exposing the end surfaces 46 of the channel region 40, the channel region 40 may be doped directly, i.e., conductivity-determining ions may be introduced through the exposed end surfaces 46 rather than through the now-etched end regions 42 as is done conventionally. In FIG. 5, a first ion implantation, such as a halo implant, is performed with conductivity-determining ions indicated by arrows 50. As shown, the conductivity-determining ions 50 may be implanted at an angle 52, such as substantially perpendicular, to the end surfaces 46. In an exemplary embodiment, the halo implant is performed with an implant angle 52 of approximately 90° to approximately 120° to the end surfaces 46. In another embodiment, the halo implant is performed to an implant depth of approximately 5 nm to approximately 42 nm. In yet another embodiment, the halo implant is performed by implanting ions selected from a group consisting essentially of B+, BF$_2$+, In+, Ga+, As+, Sb+, P+, Ge, N and F. In a further embodiment, the halo implant is performed at an energy in the range of about 3 KeV to about 30 KeV. The ion implantation forms a substantially uniform implant region or doped halo region 54. Further, the channel region 40 is completely doped, i.e., the doped region 54 is coextensive with the channel region 40.

Figure 6:
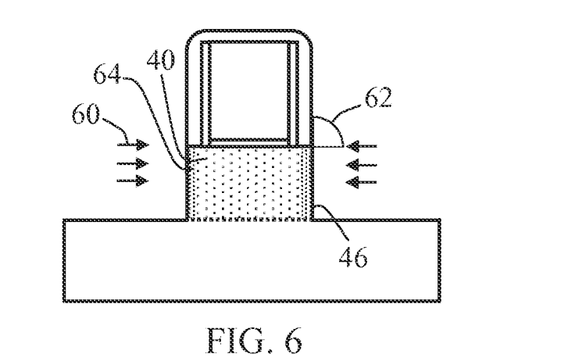

In an embodiment, a second ion implantation, such as an extension implant, is further performed as shown in FIG. 6. The second ion implantation is performed with conductivity-determining ions indicated by arrows 60. As shown, the conductivity-determining ions 60 may be implanted at an angle 62, such as substantially perpendicular, to the end surfaces 46. An exemplary extension implant is performed with an implant angle 62 of approximately 90° to approximately 120° to the end surfaces 46. In another embodiment, the extension implant is performed to an implant depth of approximately 1 nm to approximately 5 nm. In yet another embodiment, the extension implant is performed by implanting ions selected from a group consisting essentially of B+, BF$_2$+, In+, Ga+, As+, Sb+, P+, Ge, N and F. In a further embodiment, the extension implant is performed at an energy in the range of about 2 KeV to about 15 KeV. The ion implantation forms a doped extension region 64 adjacent the end surfaces 46 in the channel region 40.

Figure 7:
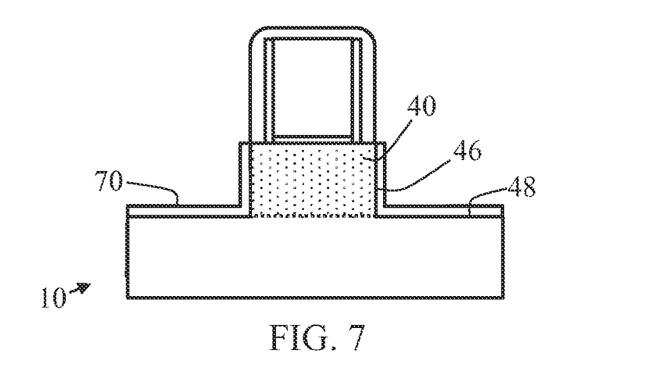

FIG. 7 illustrates an alternative step to performing the second ion implantation. In FIG. 7, an in situ doped epitaxial layer 70 is grown on the partially completed integrated circuit 10 of FIG. 5. Specifically, the in situ doped epitaxial layer 70 is grown on the end surfaces 46 of the channel region 40 and on the lower trench surface 48. The in situ doped epitaxial layer 70 may be doped as is suitable to form desired extension regions. For example, when forming an nFET, the in situ doped epitaxial layer 70 may be silicon doped with phosphorus, arsenic, carbon, or some other dopants, with a thickness of from about 1 nm to about 20 nm. Such an in situ doped epitaxial layer 70 may be formed using n-type dopants at concentrations ranging from about 1e20/cm$^3$ to about 5e20/cm$^3$. When forming a pFET, the in situ doped epitaxial layer 70 may be SiGe doped with boron, carbon or other dopants, with a thickness of from about 1 nm to about 20 nm. Such an in situ doped epitaxial layer 70 may be formed using p-type dopants at concentrations ranging from about 1e20/cm$^3$ to about 5e20/cm$^3$ (for dopants such as boron) or at concentrations ranging from about 1e19/cm$^3$ to about 4e20/cm$^3$ (for dopants such as carbon). As is understood and in accordance with the embodiments discussed in FIGS. 9-12, formation of in situ doped epitaxial layer 70 is performed for nFETs while pFETs are masked, and is performed for pFETs while nFETs are masked. Referring back to FIG. 7, an annealing step is performed after formation of the in situ doped epitaxial layer 70 to diffuse ions from the in situ doped epitaxial layer 70 into the channel region 40 to form the doped extension region 64 as shown in FIG. 6.

Figure 8:
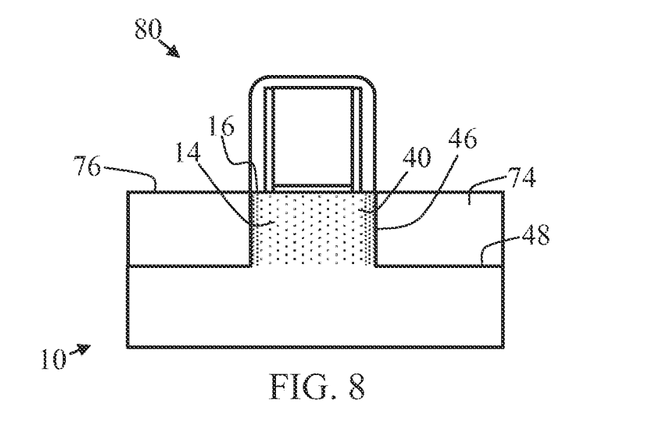

Continuing from both exemplary embodiments of FIGS. 6 and 7, source/drain regions 74 are formed around the channel region 40 after the respective implantation process is completed as shown in FIG. 8. For example, an in situ doped epitaxial material is grown to form the source/drain regions 74. The in situ doped epitaxial material forming the source/drain regions 74 may be selected so that the source/drain regions 74 need not undergo further implantation processes and may be, for example, grown using a silicon source or silicon and germanium sources. For example, when forming an nFET, the in situ doped epitaxial material may be silicon doped with phosphorus, arsenic, carbon, or some other dopants, formed using n-type dopants at concentrations ranging from about 2e20/cm$^3$ to about 2e21/cm$^3$ (for dopants such as phosphorus). When forming a pFET, the in situ doped epitaxial material may be SiGe doped with boron, carbon or other dopants, formed using p-type dopants at concentrations ranging from about 2e20/cm$^3$ to about 2e21/cm$^3$ (for dopants such as boron). As formed, the source/drain regions 74 have more dopants than the extension regions formed by the in situ doped epitaxial layers 70. In accordance with the embodiments discussed in FIGS. 9-12, formation of the in situ doped epitaxial material forming the source/drain regions 74 is performed for nFETs while pFETs are masked, and is performed for pFETs while nFETs are masked.

As shown in FIG. 8, the source/drain regions 74 are formed along the end surfaces 46 and trench lower surfaces 48 (or overlying the in situ doped epitaxial layer 70 of FIG. 7 and form an upper surface 76 substantial coplanar with the top surface 16 of the fin structure 14. Further, the source/drain regions 74 form part of fin structure 14. As a result of the process illustrated in FIGS. 2-8, integrated circuit 10 is provided with a FinFET structure 80 of FIG. 8 having a completely doped channel region 40.

Figure 9:
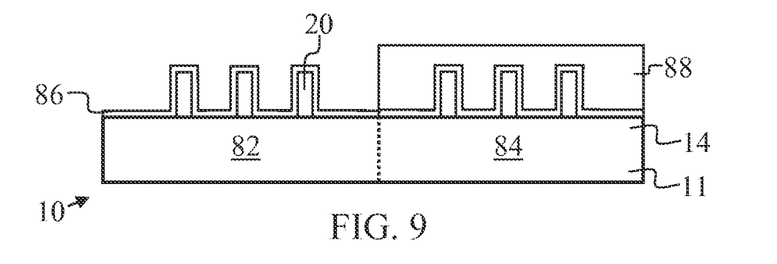
FIGS. 9-12 illustrate, in cross section, a portion of an integrated circuit and method steps for fabricating an integrated circuit having a plurality of FinFETS in accordance with various embodiments herein.

In FIGS. 9-12, a plurality of FinFET structures are formed in accordance with the steps illustrated in FIGS. 2-8. In FIG. 9, gate structures 20 are formed overlying a first type region 82, such as an N-type or P-type region, and overlying a second type region 84, such as a P-type or N-type region, overlying the fin structure 14 on the semiconductor substrate 11 according to well-known process steps. As shown, a spacer material 86 is deposited over the gate structures 20 and fin structure 14. Then, a mask 88 is deposited and patterned over the integrated circuit 10 to cover the second type region 84 and expose the first type region 82.

Figure 10:
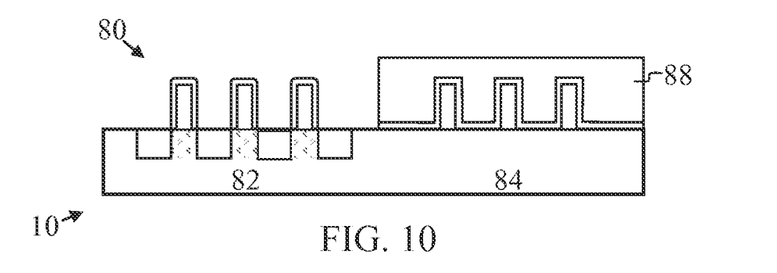

In FIG. 10, the spacer material overlying the first type region 82 is etched to form spacers in accordance with the steps illustrated in FIG. 3. Then, the end regions of the fin structure in the first type region 82 are etched to expose the end surfaces of the channel regions in the first type region 82 as described above in relation to FIG. 4. Further, the channel regions in the first type region 82 are doped in accordance with the steps of FIGS. 5-7, and source/drain regions are re-formed around the channel regions in accordance with the process of FIG. 8. As a result, FinFET structures 80 with improved doped channel regions are formed overlying the first type region 82.

Figure 11:
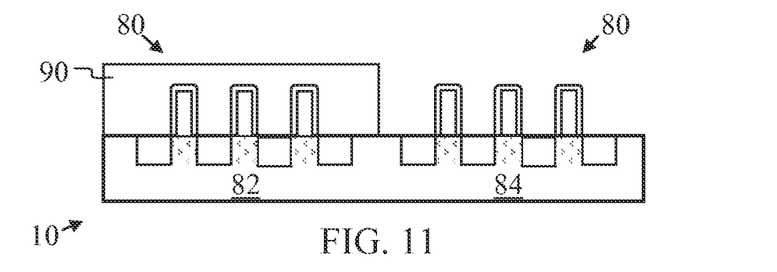

The mask 88 is removed from the second type region 84 in FIG. 11. Further, a mask 90 is deposited and patterned over the integrated circuit 10 to cover the first type region 82 and expose the second type region 84. Again, the spacer material is etched to form spacers in accordance with the process of FIG. 3, the end regions of the fin structure in the second type region 84 are etched to expose the end surfaces of the channel regions in the second type region 84 as described above in relation to FIG. 4. Further, the channel regions in the second type region 84 are doped in accordance with the steps of FIGS. 5-7, and source/drain regions are re-formed around the channel regions in accordance with the process of FIG. 8. As a result, FinFET structures 80 with improved doped channel regions are formed overlying the second type region 84.

Figure 12:
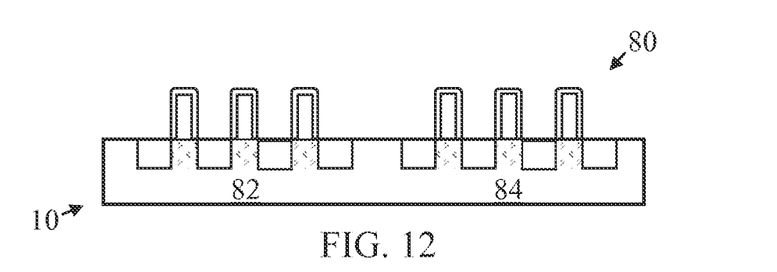

In FIG. 12, the mask 90 is removed and further processing may be performed to complete the integrated circuit 10. As shown, FinFET structures 80 are formed with completely doped channel regions overlying the first type region 82 and the second type region 84.

The integrated circuits and fabrication methods described herein result in improved channel region formation in fin structures in FinFETs. The fabrication methods avoid improper doping of channel regions by forming channel regions with exposed end surfaces and doping the channel regions directly through the end surfaces rather than through adjacent source/drain regions. As a result, the channel regions can be completely doped rather than only doped at their periphery.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   forming a channel region of a fin structure with a first side, a second side, an exposed first end surface and an exposed second end surface;
   forming a gate overlying the first side and second side of the channel region;
   forming an in-situ doped epitaxial layer along the exposed first end surface and the exposed second end surface;
   annealing the integrated circuit to diffuse ions from the in-situ doped epitaxial layer into the channel region; and
   forming source/drain regions of the fin structure adjacent the exposed first end surface and the exposed second end surface of the channel region.

2. The method of claim 1 further comprising implanting ions into the channel region through the exposed first end surface and the exposed second end surface to form an implant region coextensive with the channel region.

3. The method of claim 1 wherein:
   forming source/drain regions of the fin structure adjacent the exposed first end surface and the exposed second end surface of the channel region comprises forming a source/drain in-situ doped epitaxial material overlying the in-situ doped epitaxial layer.

4. The method of claim 1 wherein forming a channel region of a fin structure comprises:
   forming the fin structure comprising a first end region, a second end region, and the channel region between the first end region and the second end region; and
   etching the first end region and the second end region to form the exposed first end surface and the exposed second end surface.

5. The method of claim 1 wherein forming a channel region of a fin structure comprises forming the channel region overlying a semiconductor substrate and having a fin height extending from the semiconductor substrate to an upper surface of the fin structure, and wherein the exposed first end surface and the exposed second end surface each extend from the semiconductor substrate to the upper surface of the fin structure.

6. The method of claim 1 wherein forming source/drain regions of the fin structure adjacent the exposed first end surface and the exposed second end surface of the channel region comprises epitaxially growing semiconductor material adjacent the exposed first end surface and the exposed second end surface.

7. The method of claim 1 wherein forming a channel region of a fin structure comprises forming the channel region of the fin structure overlying a semiconductor substrate surface with the exposed first end surface substantially perpendicular to the semiconductor substrate surface and the exposed second end surface substantially perpendicular to the semiconductor substrate surface.

8. A method for fabricating an integrated circuit, the method comprising:
   forming a fin structure over a semiconductor material layer, wherein the fin structure has a fin height from the semiconductor material layer to an upper surface of the fin structure;
   forming a gate structure overlying the fin structure, wherein a portion of the fin structure lying under the gate structure is defined as a channel region;
   exposing end surfaces of the channel region, wherein each end surface of the channel region has an exposed height equal to the fin height;
   implanting ions into the end surfaces of the channel region; and
   forming source/drain regions of the fin structure adjacent the channel region.

9. The method of claim 8 wherein exposing end surfaces of the channel region comprises etching end regions of the fin structure to completely remove the end regions of the fin structure.

10. The method of claim 8 wherein exposing end surfaces of the channel region comprises etching end regions of the fin structure using the gate structure as a mask.

11. The method of claim 8 further comprising forming an epitaxial layer along the end surfaces after implanting ions into the end surfaces, wherein forming the source/drain regions comprises forming the source/drain regions on the epitaxial layer.

12. The method of claim 8 further comprising forming a first epitaxial layer along the exposed first end surface and the exposed second end surface, wherein forming source/drain regions of the fin structure adjacent the channel region comprises epitaxially growing semiconductor material adjacent the end surfaces and overlying the first epitaxial layer.

13. The method of claim 8 wherein implanting ions into the end surfaces of the channel region comprises:
   forming an epitaxial layer along the end surfaces of the channel region; and
   annealing the integrated circuit to diffuse ions from the epitaxial layer into the channel region.

14. The method of claim 8 wherein exposing end surfaces of the channel region comprises:
   exposing opposite side surfaces and the upper surface of end regions of the fin structure; and
   etching the end regions of the fin structure using the gate structure as a mask to expose end surfaces of the channel region.

15. The method of claim 8 wherein the channel region has a bottom surface coplanar with a top surface of the semiconductor material layer and wherein implanting ions into the end surfaces of the channel region comprises forming an implant region coextensive with the channel region.

16. A method for fabricating an integrated circuit, the method comprising:
   forming a fin structure of semiconductor material, wherein the fin structure has opposite side surfaces and an upper surface extending therebetween;
   forming a gate structure overlying a channel region of the fin structure;

exposing the opposite side surfaces and the upper surface of end regions of the fin structure;
etching the exposed opposite side surfaces and the upper surface of the end regions of the fin structure using the gate structure as a mask to form the channel region of semiconductor material with a first side adjacent the gate structure, an opposite second side adjacent the gate structure, an exposed first end surface aligned with the gate structure and an opposite exposed second end surface aligned with the gate structure; and
implanting ions into the exposed first end surface and the exposed second end surface of the channel region.

17. The method of claim 16 wherein the gate structure includes a spacer having a first side and a second side, wherein the exposed first end surface of the channel region is co-planar with the first side of the spacer, and wherein the exposed second end surface of the channel region is co-planar with the second side of the spacer.

18. The method of claim 16 further comprising:
forming an epitaxial layer along the first end surface and along the second end surface; and
forming source/drain regions over the epitaxial layer adjacent the first end surface and adjacent the second end surface.

19. The method of claim 16 wherein implanting ions into the exposed first end surface and the exposed second end surface of the channel region comprises:
forming an epitaxial layer along the exposed first end surface and the exposed second end surface of the channel region; and
annealing the integrated circuit to diffuse ions from the epitaxial layer into the channel region.

20. The method of claim 16 wherein:
forming the fin structure comprises forming the fin structure overlying a semiconductor material layer with a fin height from the semiconductor material layer to the upper surface; and
etching the end regions of the fin structure forms the exposed first end surface and the exposed second end surface with an exposed surface height equal to the fin height.

\* \* \* \* \*